(12) United States Patent
Ling et al.

(10) Patent No.: US 11,263,427 B2
(45) Date of Patent: Mar. 1, 2022

(54) ARRAY SUBSTRATE AND DISPLAY DEVICE

(71) Applicant: Xiamen Tianma Micro-Electronics Co., Ltd., Xiamen (CN)

(72) Inventors: Ankai Ling, Xiamen (CN); Poping Shen, Xiamen (CN); Xiuzhen Xie, Xiamen (CN); Lihua Zheng, Xiamen (CN); Xuexin Lan, Xiamen (CN); Lu Zhou, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 173 days.

(21) Appl. No.: 16/730,906

(22) Filed: Dec. 30, 2019

(65) Prior Publication Data

US 2020/0134284 A1 Apr. 30, 2020

(30) Foreign Application Priority Data

Jul. 31, 2019 (CN) .......................... 201910704610.2

(51) Int. Cl.
*G06K 9/00* (2006.01)
*H01L 27/146* (2006.01)
(Continued)

(52) U.S. Cl.
CPC .......... *G06K 9/0004* (2013.01); *G06F 3/0421* (2013.01); *H01L 27/1461* (2013.01);
(Continued)

(58) Field of Classification Search
CPC ...... G06K 9/00; G06K 9/0004; H01L 31/105; H01L 31/167; H01L 27/12; H01L 27/15;
(Continued)

(56) References Cited

U.S. PATENT DOCUMENTS

| 2018/0188583 A1* | 7/2018 | Liu ................... G02F 1/136227 |
| 2018/0203279 A1* | 7/2018 | Zhou ................. G02F 1/133512 |

(Continued)

FOREIGN PATENT DOCUMENTS

| CN | 106855669 A | 6/2017 |
| CN | 110008885 A | 7/2019 |
| CN | 110061042 A | 7/2019 |

*Primary Examiner* — Chanh D Nguyen
*Assistant Examiner* — Nguyen H Truong
(74) *Attorney, Agent, or Firm* — Alston & Bird LLP

(57) ABSTRACT

Provided are an array substrate and display device. The array substrate includes a base substrate; a fingerprint recognition unit with a light sensing structure; a light blocking layer and an electrode connecting structure arranged at a side of the light sensing structure facing away from the base substrate. The light blocking layer is provided with a collimation hole. A vertical projection of the collimation hole on the base substrate is partially overlapped with a vertical projection of the light sensing structure on the base substrate. An insulation layer is arranged between the electrode connecting structure and the light sensing structure. The insulation layer is provided with an electrode via. The electrode connecting structure is connected to the light sensing structure through the electrode via. The vertical projection of the collimation hole on the base substrate is not overlapped with a vertical projection of the electrode via on the base substrate.

16 Claims, 8 Drawing Sheets

(51) Int. Cl.
  *G06F 3/042* (2006.01)
  *H01L 27/32* (2006.01)
(52) U.S. Cl.
  CPC .. *H01L 27/14623* (2013.01); *H01L 27/14678* (2013.01); *H01L 27/323* (2013.01); *H01L 27/3234* (2013.01); *H01L 27/3272* (2013.01)
(58) Field of Classification Search
  CPC ....... H01L 27/30; H01L 27/32; H01L 27/144; H01L 27/146; H01L 33/00; H01L 51/50; H01L 51/52; H01L 27/1461; H01L 27/14623; H01L 27/14678; H01L 27/3234; H01L 27/3272; G06F 3/041; G06F 3/042; G06F 3/0421
  See application file for complete search history.

(56) References Cited

U.S. PATENT DOCUMENTS

| | | | |
|---|---|---|---|
| 2019/0026530 A1* | 1/2019 | Wu | H01L 27/146 |
| 2020/0110479 A1* | 4/2020 | Liu | G02F 1/134309 |
| 2020/0183563 A1* | 6/2020 | Weng | G06F 3/0443 |
| 2020/0411608 A1* | 12/2020 | Tang | H01L 27/3227 |
| 2021/0134896 A1* | 5/2021 | Guo | H01L 27/3218 |
| 2021/0208733 A1* | 7/2021 | Chen | G06F 3/04164 |

* cited by examiner

ARRAY SUBSTRATE AND DISPLAY DEVICE

CROSS-REFERENCES TO RELATED APPLICATIONS

This application claims priority to Chinese patent application No. CN201910704610.2, entitled "Array Substrate And Display Device" and filed on Jul. 31, 2019, the disclosure of which is incorporated therein by reference in its entirety.

TECHNICAL FIELD

The present disclosure relates to display technology, in particular, to an array substrate and a display device.

BACKGROUND

Under-screen finger print recognition is a technology that places a fingerprint acquisition window in a display area of a display device. Under-screen fingerprint recognition eliminates the need to reserve a space in a non-display area of the display device for placing the fingerprint acquisition window, providing the advantage of increasing a screen-to-body ratio and enables the possibility of implementing a real full screen on the display device.

The under-screen fingerprint recognition mainly uses penetration technologies such as ultrasonic and optics. In an optics fingerprint recognition technology, a fingerprint recognition unit is usually arranged on an array substrate of the display device. In the fingerprint identification unit, a photodiode is generally used as a light sensing structure. A collimation hole and an electrode via are arranged in the middle of the light sensing structure. The collimation hole is used for preventing crosstalk of light. The electrode via is used for providing a channel for an electrode connecting structure to enable the electrode connecting structure to be connected to the light sensing structure. However, the difficulty of the process of nesting the collimation hole with the electrode via (along a direction perpendicular to a plane of the array substrate) is great and it is easy to cause residual photoresist and optical loss.

SUMMARY

The present disclosure provides an array substrate and display device to reduce the difficulty of the process, avoid the residual photoresist and reduce the optical loss.

In the first aspect, the present disclosure provides an array substrate. The array substrate includes a base substrate, a fingerprint recognition unit with a light sensing structure, a light blocking layer and an electrode connecting structure arranged at a side of the light sensing structure facing away from the base substrate.

The light blocking layer is provided with a collimation hole. A vertical projection of the collimation hole on the base substrate is partially overlapped with a vertical projection of the light sensing structure on the base substrate.

An insulation layer is arranged between the electrode connecting structure and the light sensing structure. The insulation layer is provided with an electrode via. The electrode connecting structure is connected to the light sensing structure through the electrode via.

The vertical projection of the collimation hole on the base substrate is not overlapped with a vertical projection of the electrode via on the base substrate.

In the second aspect, the present disclosure further provides a display device. The display device includes the array substrate described in any embodiment of the present disclosure.

For the array substrate provided by the present disclosure, the vertical projection of the collimation hole on the base substrate is partially overlapped with the vertical projection of the light sensing structure on the base substrate, the vertical projection of the electrode via on the base substrate is partially overlapped with the vertical projection of the light sensing structure on the base substrate and the vertical projection of the collimation hole on the base substrate is not overlapped with a vertical projection of the electrode via on the base substrate. Thus, the collimation hole and the electrode via are distributed in a stagger order in an area where the light sensing structure is located.

DETAILED DESCRIPTION

The present disclosure will be further described in detail hereinafter in conjunction with the drawings and embodiments. It may be understood that the specific embodiments described herein are used only for interpreting the present disclosure and not for limiting the present disclosure. In addition, it should be noted that, for ease of description, the drawings only shows a part related to the present disclosure, not the whole structure of the present disclosure.

Figure 1:
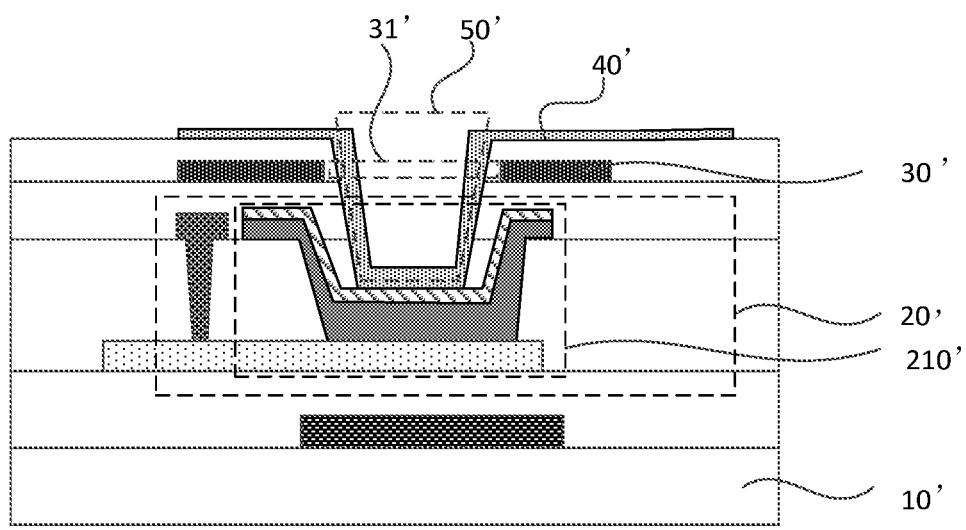
FIG. 1 is a structural diagram of an array substrate provided by an embodiment of the present disclosure.

FIG. 1 is a structural diagram of an array substrate provided by the present disclosure. Referring to FIG. 1, the array substrate includes a base substrate 10', a fingerprint recognition unit 20', a light blocking layer 30' and an electrode connecting structure 40'. The fingerprint recognition unit 20' includes a light sensing structure 210'. The light blocking layer 30' is arranged at a side of the light sensing structure 210' facing away from the base substrate 10'. The electrode connecting structure 40' is arranged at a side of the light blocking layer 30' facing away from the base substrate 10'. The light blocking layer 30' is provided with a collimation hole 31'. A vertical projection of the collimation hole 31' on the base substrate 10' is partially overlapped with a vertical projection of the light sensing structure 210' on the base substrate 10'. An insulation layer is arranged between the electrode connecting structure 40' and the light sensing structure 210'. The insulation layer is provided with an electrode via 50'. The electrode connecting structure 40' is connected to the light sensing structure 210' through the electrode via 50'. A vertical projection of the electrode via 50' on the base substrate 10' is overlapped with the vertical projection of the collimation hole 31' on the base substrate 10'. Continuing to refer to FIG. 1, applicants of the present disclosure found the array substrate shown in FIG. 1 has the following problem: in a direction perpendicular to a plane of the base substrate 10', the collimation hole 31' is nested with the electrode via 50', the electrode via 50' passes through multiple layers, each of the multiple layers has a layer via in an area where the electrode via 50' is located, and multiple layer vias are nested together, so that the residual photoresist and great difficulty of the process are easily caused. In addition, due to the limitation of the process, an angle may exist between a side wall of the layer via in the layers at the side of the collimation hole 31' facing away from the base substrate 10' and the direction perpendicular to the plane of the base substrate 10'. When light irradiates on the side wall of such layer via, the light will be reflected, resulting in the waste of the reflected light.

In view of this, the applicants of the present disclosure made further research. Example embodiments of the present disclosure provides another array substrate. The array substrate includes a base substrate; a fingerprint recognition unit with a light sensing structure; a light blocking layer and an electrode connecting structure arranged at a side of the light sensing structure facing away from the base substrate. The light blocking layer is provided with a collimation hole. A vertical projection of the collimation hole on the base substrate is partially overlapped with a vertical projection of the light sensing structure on the base substrate. An insulation layer is arranged between the electrode connecting structure and the light sensing structure. The insulation layer is provided with an electrode via. The electrode connecting structure is connected to the light sensing structure through the electrode via. The vertical projection of the collimation hole on the base substrate is not overlapped with a vertical projection of the electrode via on the base substrate.

The technical solution of the present disclosure will be described clearly and completely hereinafter in conjunction with the drawings of example embodiments of the present disclosure. Based on example embodiments of the present disclosure, all other embodiments obtained by ordinary skilled in the art without the exercise of inventive faculty are within the protection scope of the present disclosure.

Figure 2:
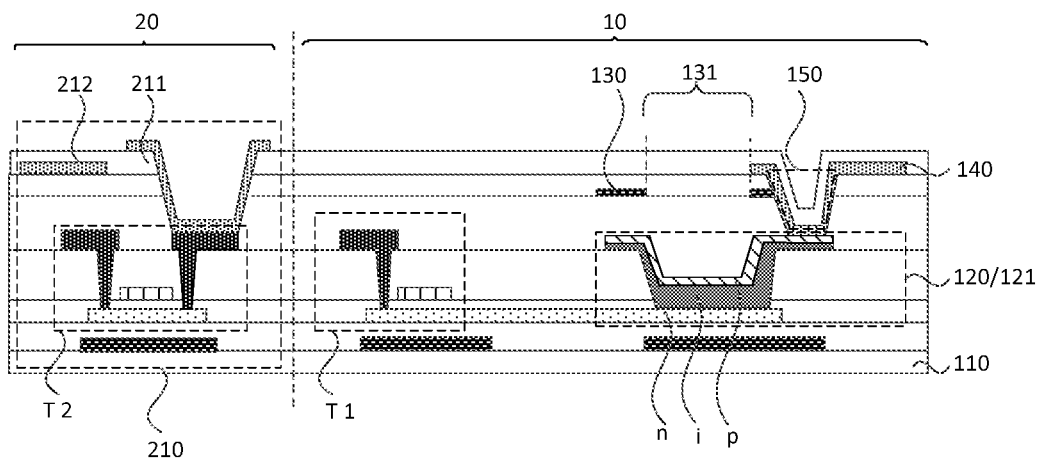
FIG. 2 is a structural diagram of an array substrate provided by an embodiment of the present disclosure.

FIG. 2 is a structural diagram of an array substrate provided by one example embodiment of the present disclosure. Referring to FIG. 2, the array substrate includes a base substrate 110, a fingerprint recognition unit 120, a light blocking layer 130 and an electrode connecting structure 140. The fingerprint recognition unit 120 includes a light sensing structure 121. The light blocking layer 130 and the electrode connecting structure 140 are arranged at the side of the light sensing structure 121 facing away from the base substrate 110. The light blocking layer 130 is provided with a collimation hole 131. The vertical projection of the collimation hole 131 on the base substrate 110 is partially overlapped with the vertical projection of the light sensing structure 121 on the base substrate 110. An insulation layer is arranged between the electrode connecting structure 140 and the light sensing structure 121. The insulation layer is provided with an electrode via 150. The electrode connecting structure 140 is connected to the light sensing structure 121 through the electrode via 150. The vertical projection of the collimation hole 131 on the base substrate 110 is not overlapped with the vertical projection of the electrode via 150 on the base substrate 110.

Optionally, as shown in FIG. 2, along a direction from the base substrate 110 towards the light blocking layer 130, the light sensing structure 121 includes an N-type semiconductor layer n, an intrinsic semiconductor layer i and a P-type semiconductor layer p sequentially stacked together, and the electrode connecting structure 140 is connected to the P-type semiconductor layer p through the electrode via 150. Alternatively, along the direction from the base substrate 110 towards the light blocking layer 130, the light sensing structure 121 includes a P-type semiconductor layer p, an intrinsic semiconductor layer i and a N-type semiconductor layer n sequentially stacked together, and the electrode connecting structure 140 is connected to the N-type semiconductor layer n through the electrode via 150.

Specifically, the material of the P-type semiconductor layer p is P-type polycrystalline silicon, the material of the intrinsic semiconductor layer i is intrinsic amorphous silicon, and the material of the N-type semiconductor layer n may be any one of N-type polycrystalline silicon or N-type amorphous silicon. Thus, the light sensing structure 121 is stacked by polycrystalline silicon and amorphous silicon in a mixed order.

Specifically, continuing to refer to FIG. 2, the array substrate includes a display area 20 and a fingerprint recognition area 10. The display area 20 includes multiple pixel units to display images. The fingerprint recognition area 10 includes multiple fingerprint recognition units 120 to implement fingerprint recognition. For example, FIG. 3 is a schematic diagram of equivalent circuit of the fingerprint recognition unit provided by an embodiment of the present disclosure.

Figure 3:
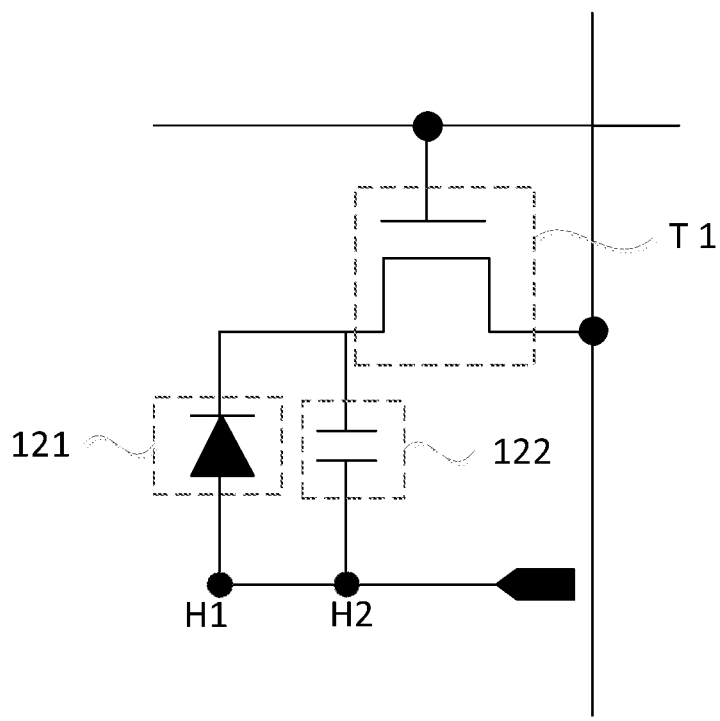
FIG. 3 is a schematic diagram of equivalent circuit of a fingerprint recognition unit provided by an embodiment of the present disclosure.

Referring to FIG. 2 and FIG. 3, the fingerprint recognition unit 120 includes the light sensing structure 121 and a storage capacitance 122 (which is not shown in FIG. 2). The light sensing structure 121 is connected in parallel with the storage capacitance 122. An entire fingerprint recognition stage may include a preparation stage, a fingerprint recognition signal acquisition stage and a fingerprint signal detection stage. In the preparation stage, a switching thin film transistor T1 is turned on, and the storage capacitance 122 is charged until the charging is completed. In the fingerprint recognition signal acquisition stage, the switching thin film transistor T1 is turned off, the light reflected from a touch body irradiates on the light sensing structure 121 to generate photocurrent. The storage capacitance 122 and the light sensing structure 121 form a discharge circuit. The direction of the photocurrent is from a node H2 towards a node H1, so that the potential of the node H2 changes. In the fingerprint signal detection stage, variation of the potential of the node H2 may be directly detected to determine the magnitude of the photocurrent, so as to implement fingerprint recognition function.

Specifically, multiple light sensing structures 121 may be arranged in the fingerprint recognition area 10. The light blocking layer 130 may be provided with multiple collimation holes 131. Each of the multiple collimation holes 131 corresponds to a respective one of the multiple light sensing structures 121. The multiple collimation holes 131 in the light blocking layer 130 cause, among the light reflected from the touch body, the light with an angle smaller than a preset value relative to the direction perpendicular to the plane of the array substrate to irradiate on the light sensing structure 121 opposite to the collimation hole 131, and the light with an angle larger than the preset value relative to the direction perpendicular to the plane of the array substrate to be shielded. Thus, the crosstalk caused by the light reflected from different positions of the touch body irradiating to the same light sensing structure 121 is avoided. The shape of the collimation hole 131 may be a circle or a rectangle. Those skilled in the art may set the shape of the collimation hole 131 according to actual situations.

Specifically, the electrode connecting structure 140 is configured to be connected to the light sensing structure 121. One end of the electrode connecting structure 140 may be closely connected to the light sensing structure 121 through the electrode via 150, and another end (which is not shown in FIG. 2) of the electrode connecting structure 140 is connected to a terminal (which is not shown in FIG. 2) providing an operating voltage signal for the light sensing structure 121, so that the light sensing structure 121 may receive the operating voltage signal. The material of the electrode connecting structure 140 may be any one of ITO (Indium Tin Oxides) or ATO (Antimony Doped Tin Oxide), or other transparent conductive materials. This is not limited in the present disclosure.

It may be understood that, in some embodiments of the present disclosure, the collimation hole 131 and the electrode via 150 are distributed in a stagger order, so that the number of the layers passed through by the electrode via 150 is reduced (at least the electrode via 150 does not have to pass through the light blocking layer). Thus, the difficulty of the process forming the electrode via 150 and the possibility of the residual photoresist are reduced. In addition, by distributing the collimation hole 131 and the electrode via 150 in the stagger order, the layers arranged at the side of the collimation hole 131 facing away from the base substrate 110 doe not need to be provided with the layer vias at the positions corresponding to the collimation hole 131, and the waste of the reflected light when the light irradiates on these layers is avoided.

Specifically, there are many manners of distributing the collimation hole 131 and the electrode via 150d in the stagger order. Optionally, the light sensing structure 121 includes a central area and an edge area surrounding the central area. As shown in FIG. 2, a vertical projection of the collimation hole 131 on the light sensing structure 121 is arranged in the central area, and a vertical projection of the electrode via 150 on the light sensing structure 121 is arranged in the edge area. This arrangement is advantageous to the electrode connecting structure 140 to bypass an area where the collimation hole 131 is located, that is, a vertical projection of the electrode connecting structure 140 on the light blocking layer 130 is not overlapped with the collimation hole 131, so as to reduce the number of the layers passed through by the light reflected from the touch body, and reduce the optical loss.

For the array substrate provided by example embodiments of the present disclosure, the vertical projection of the collimation hole on the light sensing structure is partially overlapped with the light sensing structure, the vertical projection of the electrode via on the light sensing structure is partially overlapped with the light sensing structure, and the vertical projection of the collimation hole on the light sensing structure is not overlapped with the vertical projection of the electrode via on the light sensing structure, thereby reducing the difficulty of the process, avoiding the residual photoresist and reducing the optical loss.

Figure 4:
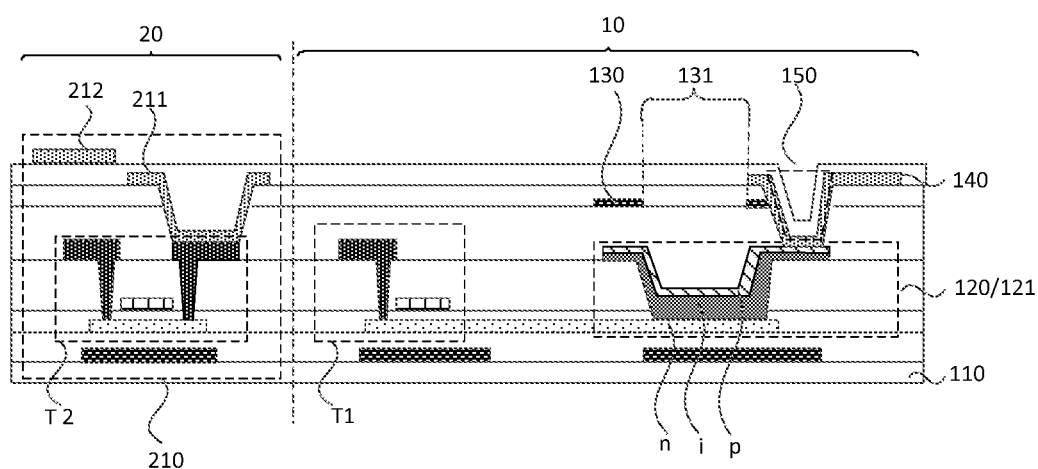
FIG. 4 is a structural diagram of another array substrate provided by an embodiment of the present disclosure.
Figure 5:
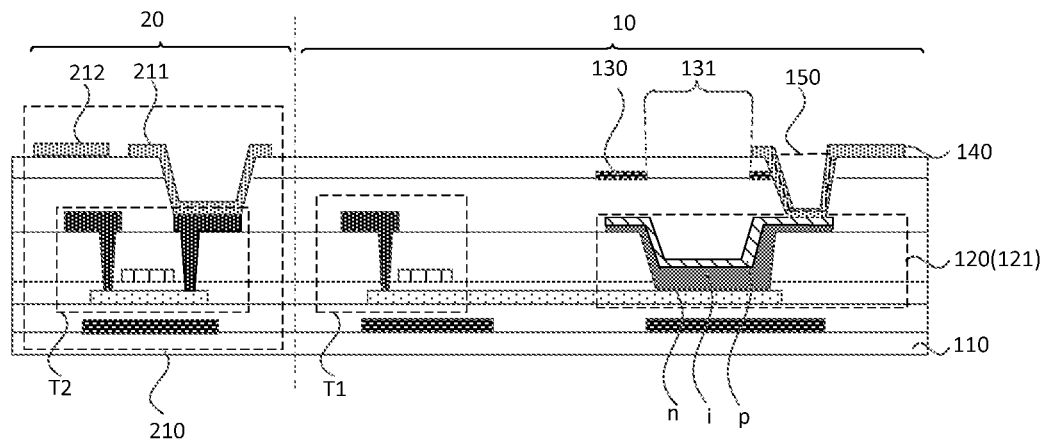
FIG. 5 is a structural diagram of another array substrate provided by an embodiment of the present disclosure.

FIG. 4 is a structural diagram of another array substrate provided by example embodiments of the present disclosure. FIG. 5 is a structural diagram of another array substrate provided by an example embodiment of the present disclosure. Referring to FIG. 2, FIG. 4 and FIG. 5, optionally, the array substrate further includes multiple pixel units 210. Each of the multiple pixel units 210 includes a pixel electrode 211 and a common electrode 212. The electrode connecting structure 140 and the pixel electrode 211 are arranged on the same layer and made of the same material, or the electrode connecting structure 140 and the common electrode 212 are arranged on the same layer and made of the same material.

Optionally, as shown in FIG. 2, the pixel electrode 211 and the common electrode 212 are arranged in different layers, and the common electrode 212 is arranged between the pixel electrode 211 and the base substrate. At this time, the electrode connecting structure 140 and the pixel electrode 211 may be arranged on the same layer, or the electrode connecting structure 140 and the common electrode 212 are arranged on the same layer. Preferably, as shown in FIG. 2, the electrode connecting structure 140 and the common electrode 212 are arranged on the same layer. In this way, the number of the layers passed through by the electrode via 150 may be reduced, so that the difficulty of the process of the electrode via 150 is reduced and the residual photoresist is avoided.

Optionally, as shown in FIG. 4, the pixel electrode 211 and the common electrode 212 are arranged on different layers, and the pixel electrode 211 is arranged between the common electrode 212 and the base substrate. At this time, the electrode connecting structure 140 and the pixel electrode 211 may be arranged on the same layer, or the electrode connecting structure 140 and the common electrode 212 are arranged on the same layer. Preferably, as shown in FIG. 4, the electrode connecting structure 140 and the pixel electrode 211 are arranged on the same layer. In this way, the number of layers passed through by the electrode via 150 may be reduced, so that the difficulty of the process of the electrode via 150 is reduced and the residual photoresist is avoided.

Optionally, as shown in FIG. 5, the pixel electrode 211 and the common electrode 212 are arranged on the same layer and made of the same material. This arrangement is advantageous to cause the arrangement relation of the array substrate to be simple, and the design requirement of the thin array substrate to be implemented easily.

Specifically, the material of the pixel electrode 211 and the material of the common electrode 212 may be any one of the ITO or the ATO, or other transparent conductive materials, which is not limited in the present disclosure.

It should be noted that, in the above arrangements, the electrode connecting structure 140 and the pixel electrode 211, or the electrode connecting structure 140 and the common electrode 212 are arranged on the same layer and made of the same material, so as to ensure that the preparation process of the electrode connecting structure 140 matches with the preparation process of the existing array substrate, and ensure that the preparation process of the electrode connecting structure 140 is simple. This may further cause the arrangement relation of the array substrate to be simple, and the design requirement of the thin array substrate to be implemented easily.

Figure 6:
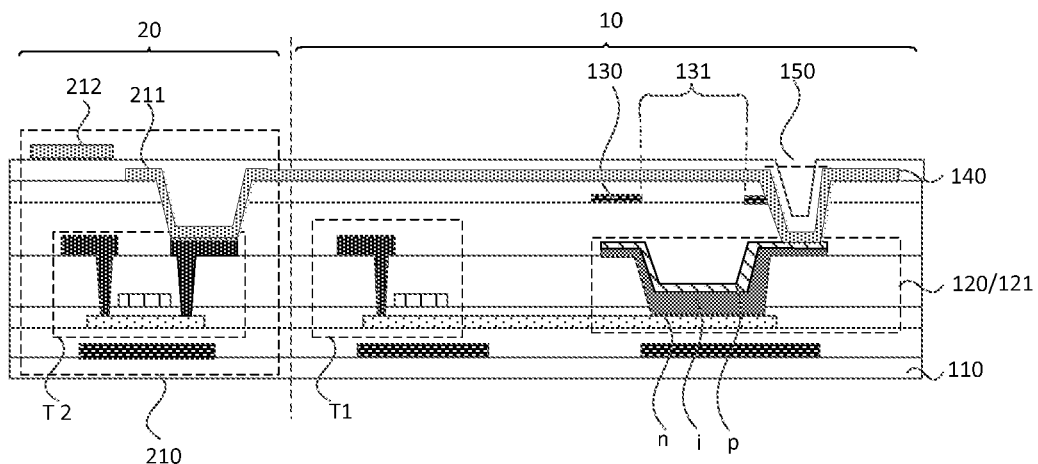
FIG. 6 is a structural diagram of an array substrate provided by an embodiment of the present disclosure.
Figure 7:
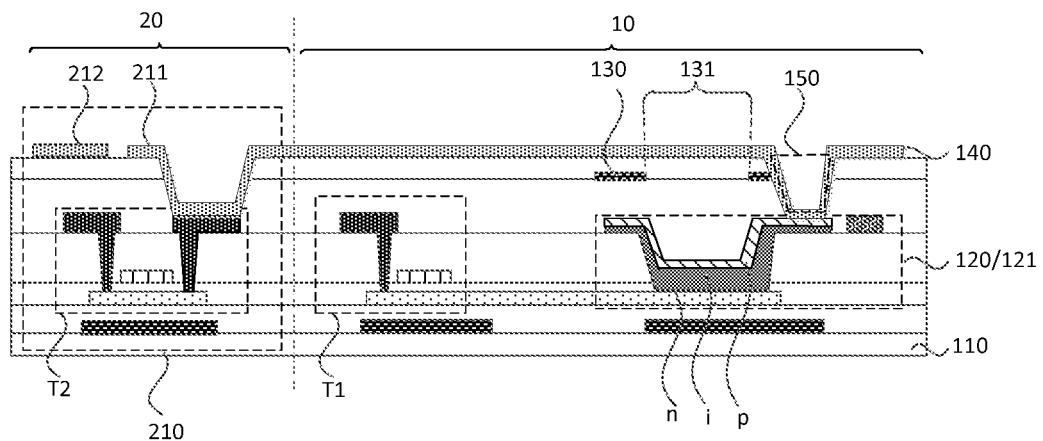
FIG. 7 is a structural diagram of another array substrate provided by an embodiment of the present disclosure.

FIG. 6 is a structural diagram of an array substrate provided by example embodiments of the present disclosure. FIG. 7 is a structural diagram of another array substrate provided by example embodiments of the present disclosure. Referring to FIG. 6 and FIG. 7, optionally, the array substrate may further include the multiple pixel units 210. Each of the multiple pixel units 210 includes the pixel electrode 211 and the common electrode 212. One or more of the pixel electrodes 211 or one or more of the common electrodes 212 are reused as the electrode connecting structure 140. The electrode connecting structure 140 is configured to provide the pixel electrode 211 or the common electrode 212 with a display drive signal in a display stage, and provide the light sensing structure 121 with an operating voltage signal in the fingerprint recognition stage.

Specifically, among the multiple pixel electrodes 211, the pixel electrode 211 of which the vertical projection on the light sensing structure 121 is at least partially overlapped with the light sensing structure 121 may be reused as the electrode connecting structure 140. Specifically, among the multiple common electrodes 212, the common electrode 212 of which the vertical projection on the light sensing structure 121 is at least partially overlapped with the light sensing structure 121 may be reused as the electrode connecting structure 140. The shape of the pixel electrode 211 and the common electrode 212 may be a rectangle or diamond, which is not limited in the present disclosure.

Optionally, the pixel electrode 211 and the common electrode 212 are arranged on different layers, and the common electrode 212 is arranged between the pixel electrode 211 and the base substrate. At this time, one or more of the pixel electrodes 211 may be reused as the electrode connecting structure 140, or one or more of the common electrodes 212 may be reused as the electrode connecting structure 140. Preferably, one or more of the common electrodes 212 are reused as the electrode connecting structure 140. In this way, the number of the layers passed through by the electrode via 150 may be reduced, so that the difficulty of the process of the electrode via 150 is reduced and the residual photoresist is avoided.

Optionally, as shown in FIG. 6, the pixel electrode 211 and the common electrode 212 are arranged on different layers, and the pixel electrode 211 is arranged between the common electrode 212 and the base substrate. At this time, one or more of the pixel electrodes 211 may be reused as the electrode connecting structure 140, or one or more of the common electrodes 212 may be reused as the electrode connecting structure 140. Preferably, as shown in FIG. 6, one or more of the pixel electrodes 211 are reused as the electrode connecting structure 140. In this way, the number of the layers passed through by the electrode via 150 may be reduced, so that the difficulty of the process of the electrode via 150 is reduced and the residual photoresist is avoided.

Optionally, as shown in FIG. 7, the pixel electrode 211 and the common electrode 212 are arranged on the same layer and made of the same material. This arrangement is advantageous to cause the arrangement relation of the array substrate to be simple, and the resign requirement of the thin array substrate to be implemented easily. At this time, as shown in FIG. 7, one or more of the pixel electrodes 211 may be reused as the electrode connecting structure 140, or one or more of the common electrodes 212 may be reused as the electrode connecting structure 140, or one or more of the pixel electrodes 211 and one or more of the common electrodes 212 are reused as the electrode connecting structure 140, which is not limited in the present disclosure.

It should be noted that, in the above arrangements, the part of the pixel electrodes 211 or the part of the common electrodes 212 are reused as the electrode connecting structure 140, so that it is not necessary to reserve a space for the electrode connecting structure 140 on the layer where the pixel electrode 211 is located or the layer where the common electrode 212 is located. Thus, it is not necessary to change the original distribution of the multiple common electrodes 212 on the layer where the multiple common electrodes 212 are located and the original distribution of the multiple pixel electrodes 211 on the layer where the multiple pixel electrodes 211 are located.

Figure 8:
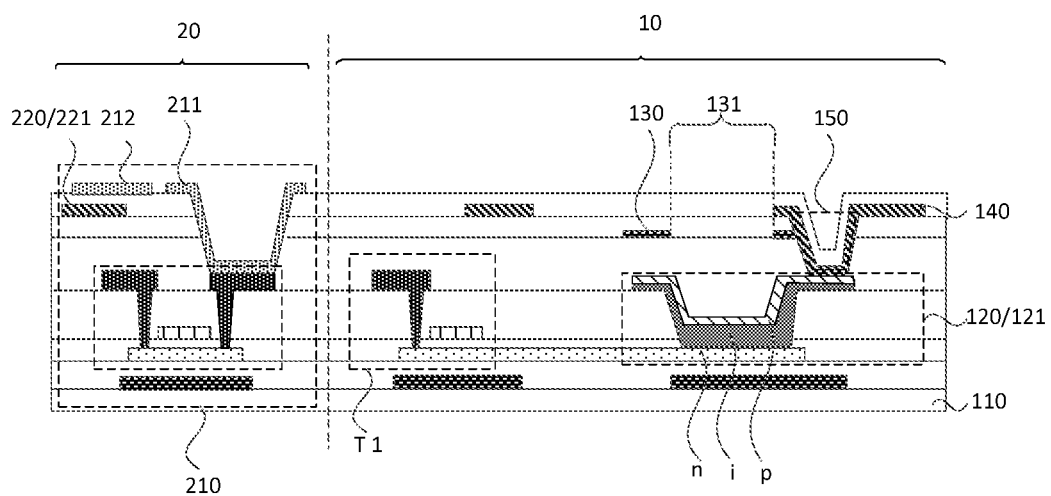
FIG. 8 is a structural diagram of an array substrate provided by an embodiment of the present disclosure.

FIG. 8 is a structural diagram of an array substrate provided by an embodiment of the present disclosure. Referring to FIG. 8, the array substrate includes a base substrate 110, a fingerprint recognition unit 120 with a light sensing structure 121, a light blocking layer 130 and a electrode connecting structure 140. Both the light blocking layer 130 and the electrode connecting structure 140 are arranged at the side of the light sensing structure 121 facing away from the base substrate 110. The light blocking layer 130 is provided with a collimation hole 131. The vertical projection of the collimation hole 131 on the base substrate 110 is partially overlapped with the vertical projection of the light sensing structure 121 on the base substrate 110. An insulation layer is arranged between the electrode connecting structure 140 and the light sensing structure 121. The insulation layer is provided with an electrode via 150. The electrode connecting structure 140 is connected to the light sensing structure 121 through the electrode via 150. The vertical projection of the collimation hole 131 on the base substrate 110 is not overlapped with the vertical projection of the electrode via 150 on the base substrate 110. Optionally, the array substrate further includes multiple pixel units 210 and a touch electrode layer 220. The touch electrode layer 200 is arranged at the side of the light sensing structure 121 facing away from the base substrate. Each of the multiple pixel units includes a pixel electrode 211 and a common electrode 212. The electrode connecting structure 140 and the touch electrode layer 220 are arranged on the same layer and made of the same material. Specifically, as shown in FIG. 8, the touch electrode layer 220 may be arranged at a side of the pixel electrode 211 and the common electrode 212 close to the base substrate. Alternatively, the touch electrode layer 220 may be arranged at a side of the pixel electrode 211 and the common electrode 212 facing away from the base substrate. Alternatively, the touch electrode layer 220 may be arranged between the pixel electrode 211 and the common electrode 212. Preferably, the touch electrode layer 220 is arranged at the side of the pixel electrode 211 and the common electrode 212 close to the base substrate, that is, as shown in FIG. 8, the touch electrode layer 220 is arranged between the pixel electrode 211 and the base substrate, and the touch electrode layer 220 is arranged between the common electrode 212 and the base substrate. This arrangement is advantageous to reduce the number of the layers passed through by the electrode via 150, so that the difficulty of the process of the electrode via 150 is reduced and the residual photoresist is avoided.

Specifically, the material of the touch electrode layer 220 may be any one of the ITO or the ATO, or other transparent conductive materials, which is not limited in the present disclosure. It should be noted that, in the above arrangements, the electrode connecting structure 140 and the touch electrode layer 220 are arranged on the same layer and made of the same material. Thus, it may be ensured that the preparation process of the electrode connecting structure 140 matches with the preparation process of the existing array substrate, and ensured that the preparation process of the electrode connecting structure 140 is simple. Furthermore, the arrangement relation of the array substrate may be simple, and the design requirement of the thin array substrate is implemented easily.

Figure 9:
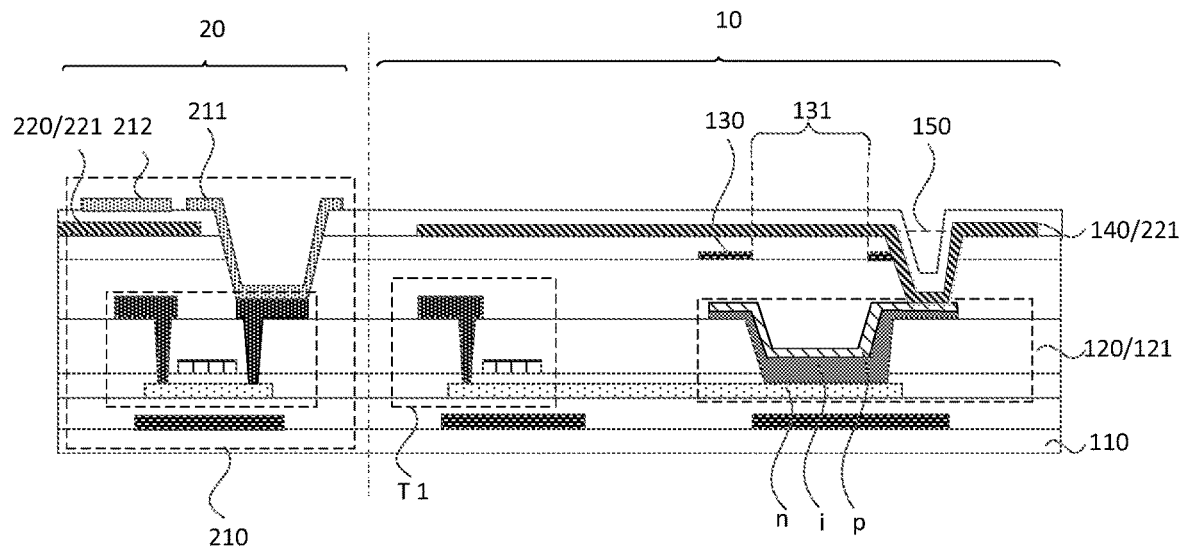
FIG. 9 is a structural diagram of another array substrate provided by an embodiment of the present disclosure.

FIG. 9 is a structural diagram of another array substrate provided by an embodiment of the present disclosure. Referring to FIG. 9, optionally, the array substrate may further include multiple pixel units 210 and a touch electrode layer 220. The touch electrode layer 220 is arranged at the side of the light sensing structure 121 facing away from the base substrate. Each of the multiple pixel units 210 includes a pixel electrode 211 and a common electrode 212. The touch electrode layer 220 includes the multiple touch electrodes 221. One or more of the multiple touch electrodes 221 are reused as the electrode connecting structure 140. The electrode connecting structure 140 is configured to provide the multiple touch electrodes 211 with a touch signal in a touch stage, and provide the light sensing structure 121 with the operating voltage signal in the fingerprint recognition stage.

Specifically, among the multiple touch electrodes 221, the touch electrode 221 of which the vertical projection on the light sensing structure 121 is at least partially overlapped with the light sensing structure 121 may be reused as the electrode connecting structure 140.

Specifically, as shown in FIG. 9, the touch electrode layer 220 may be arranged at the side of the pixel electrode 211 and the common electrode 212 close to the base substrate. Alternatively, the touch electrode layer 220 may be arranged at the side of the pixel electrode 211 and the common electrode 212 facing away from the base substrate, or the touch electrode layer 220 may be arranged between the pixel electrode 211 and the common electrode 212. Preferably, the touch electrode layer 220 is arranged at the side of the pixel electrode 211 and the common electrode 212 close to the base substrate, that is, as shown in FIG. 9, the touch electrode layer 220 is arranged between the pixel electrode 211 and the base substrate, and the touch electrode layer 220 is arranged between the common electrode 212 and the base substrate. This arrangement is advantageous to reduce the number of the layers passed through by the electrode via 150, so that the difficulty of the process of the electrode via 150 is reduced and the residual photoresist is avoided.

It should be noted that, in the above arrangements, the part of the multiple touch electrodes 221 are reused as the electrode connecting structure 140, so that it is not necessary to reserve a space for the electrode connecting structure 140. Thus, it is not necessary to change the original distribution of the multiple touch electrodes 221 in the touch electrode layer 220.

It should be noted that FIG. 8 and FIG. 9 only shows examples in which the array substrate includes one touch electrode layer 220, but is not used for limiting to the present disclosure. Those skilled in the art may set the number of the touch electrode layers 220 according to actual situations. When the number of the touch electrode layers 220 is at least two, those skilled in the art may arrange the electrode connecting structure 140 and one of the touch electrode layers 220 on the same layer and made of the same material according to actual situations (or one or more of the multiple touch electrodes 211 in one of the touch electrode layers 220 are reused as the electrode connecting structure 140 according to actual situations). Preferably, among at least two touch electrode layers 220, the touch electrode layer 220 closest to the side of the base substrate is a first touch electrode layer. The electrode connecting structure 140 and the first touch electrode layer are arranged on the same layer and are made of the same material (or one or more of the multiple touch electrodes 211 in the first touch electrode layer are reused as the electrode connecting structure 140). This arrangement is advantageous to reduce the layers passed through by the electrode via 150, so that the difficulty of the process of the electrode via 150 is reduced and the residual photoresist is avoided.

Figure 10:
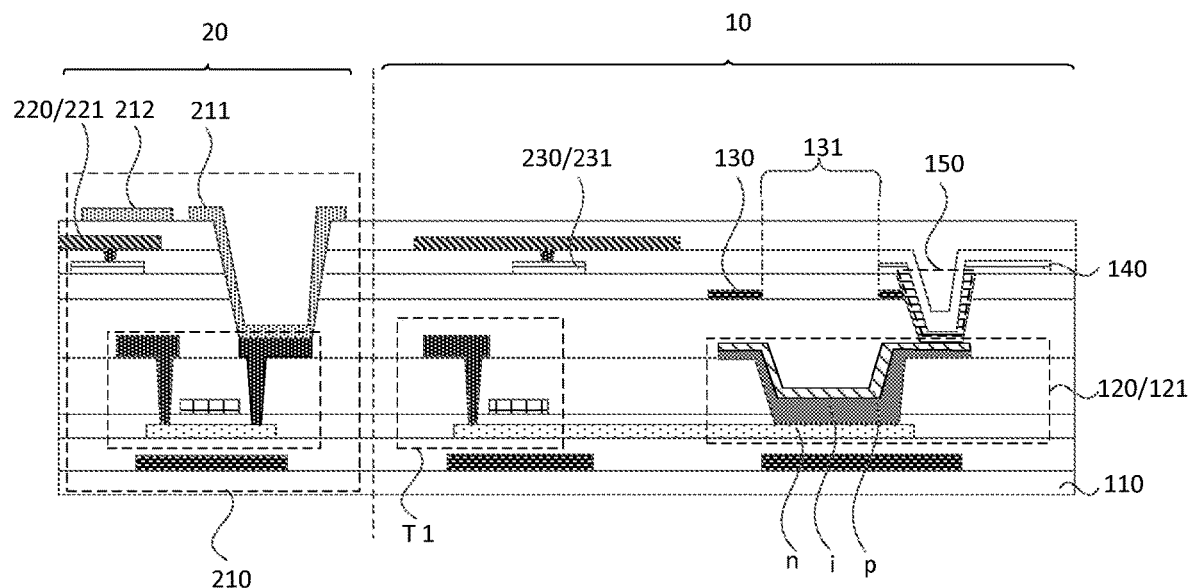
FIG. 10 is a structural diagram of an array substrate provided by an embodiment of the present disclosure.

FIG. 10 is a structural diagram of an array substrate provided by an embodiment of the present disclosure. Referring to FIG. 10, the array substrate includes a base substrate 110, a fingerprint recognition unit 120 with a light sensing structure 121, a light blocking layer 130 and an electrode connecting structure 140. Both the light blocking layer 130 and the electrode connecting structure 140 are arranged at the side of the light sensing structure 121 facing away from the base substrate 110. The light blocking layer 130 is provided with a collimation hole 131. The vertical projection of the collimation hole 131 on the base substrate 110 is partially overlapped with the vertical projection of the light sensing structure 121 on the base substrate 110. An insulation layer is arranged between the electrode connecting structure 140 and the light sensing structure 121. The insulation layer is provided with an electrode via 150. The electrode connecting structure 140 is connected to the light sensing structure 121 through the electrode via 150. The vertical projection of the collimation hole 131 on the base substrate 110 is not overlapped with the vertical projection of the electrode via 150 on the base substrate 110. Optionally, the array substrate further includes an touch electrode layer 220 and a touch lead 230. The touch electrode layer 220 is arranged at the side of the light sensing structure 121 facing away from the base substrate. The touch lead 230 is electrically connected to the touch electrode layer 220. The electrode connecting structure 140 and the touch lead 230 are arranged on the same layer and made of the same material.

Specifically, as shown in FIG. 10, the touch electrode layer 220 may be an independent layer occupying a layer in the array substrate. The touch electrode in the touch electrode layer 220 may also be reused as the common electrode 212. This arrangement is advantageous to cause the arrangement relation of the array substrate to be simple, and the design requirement of the thin array substrate to be implemented easily.

Optionally, the touch electrode layer 220 and the touch lead 230 are arranged on the same layer and made of the same material. Optionally, the touch electrode layer 220 and the touch lead 230 are arranged on different layers. At this time, as shown in FIG. 10, the touch lead 230 may be arranged between the touch electrode layer 220 and the base substrate 110. Alternatively, the touch lead 230 may be arranged at the side of the touch electrode layer 220 facing away from the base substrate 110. Preferably, as shown in FIG. 10, the touch lead 230 is arranged between the touch electrode layer 220 and the base substrate 110. In this way, the number of the layers passed through by the electrode via 150 may be reduced, so that the difficulty of the process of the electrode via 150 is reduced and the residual photoresist is avoided.

Figure 11:
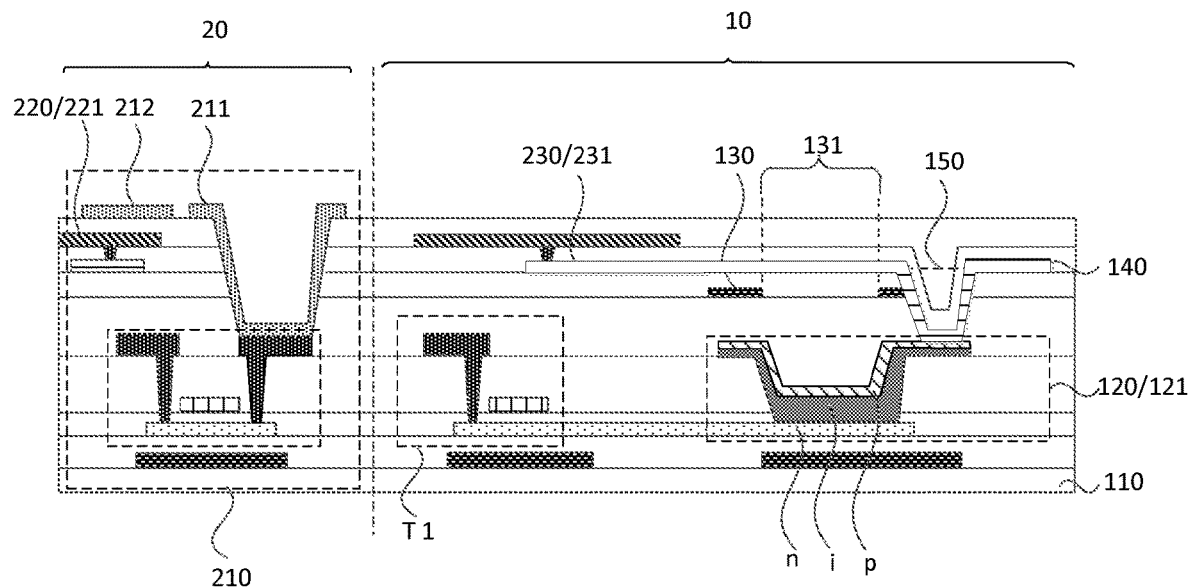
FIG. 11 is a structural diagram of an array substrate provided by an embodiment of the present disclosure.

FIG. 11 is a structural diagram of an array substrate provided by an embodiment of the present disclosure. Referring to FIG. 11, optionally, the array substrate may further include a touch electrode layer 220 and a touch lead 230. The touch electrode layer 220 is arranged at the side of the light sensing structure 121 facing away from the base substrate 110. The touch lead 230 is electrically connected to the touch electrode layer 220. The touch electrode layer 220 includes multiple touch electrodes 221. The touch lead 230 includes multiple touch sub-leads 231. Each of the multiple touch sub-leads 231 is connected to a respective one of the multiple touch electrodes 221. One or more of the multiple touch sub-leads 231 are reused as the electrode connecting structure 140. The electrode connecting structure 140 is configured to provide the touch electrodes with the touch signal in the touch stage, and provide the light sensing structure 121 with the operating voltage signal in the fingerprint recognition stage. Specifically, among the multiple touch sub-leads 231, the touch sub-leads of which vertical projection on the light sensing structure 121 is at least partially overlapped with the light sensing structure 121 may be reused as the electrode connecting structure 140.

Optionally, the touch electrode layer 220 and all of the touch sub-leads 231 are arranged on the same layer and made of the same material. Optionally, the touch electrode layer 220 and all of the touch sub-leads 231 are arranged on different layers. At this time, as shown in FIG. 10, the touch lead 230 may be arranged between the touch electrode layer 220 and the base substrate 110. Alternatively, the touch lead 230 may be arranged at the side of the touch electrode layer 220 facing away from the base substrate 110. Preferably, as shown in FIG. 10, the touch lead 230 is arranged between the touch electrode layer 220 and the base substrate 110. In this way, the number of the layers passed through by the electrode via 150 may be reduced, so that the difficulty of the process of the electrode via 150 is reduced and the residual photoresist is avoided. Optionally, among the multiple touch sub-leads 231, the touch sub-lead which is arranged on the same layer with the touch electrode layer 230 is a first touch sub-lead, and the touch sub-lead which is arranged on different layers with the touch electrode layer 230 is a second touch sub-lead. At this time, the first touch sub-lead may be reused as the electrode connecting structure 140, and the second touch sub-lead may also reused as the electrode connecting structure 140. Preferably, the touch sub-lead closest to the side of the base substrate 110 is reused as electrode connecting structure 140.

It should be noted that, in the above arrangements, one or more of the multiple touch sub-leads 231 are reused as the electrode connecting structure 140, so that it is not necessary to reserve a space for the electrode connecting structure 140. Thus, it is not necessary to change the original distribution of the multiple touch sub-leads 231 in the layer where the touch electrode layer 230 is located.

On the basis of the above technical solutions, continuing to refer to FIG. 2, FIG. 4, FIG. 5, FIG. 8, FIG. 9 or FIG. 10. Optionally, the vertical projection of at least one of the pixel electrode 211 or the common electrode 212 on the light blocking layer 130 is not overlapped with the collimation hole 131.

Specifically, when the light reflected from the touch body irradiates on an interface between two layers made of different materials, the light is reflected and the optical loss is caused. In addition, the material of the pixel electrode 211 and the material of the common electrode 212 are usually the ITO or the ATO. For the ITO, penetration rate of it is about 90%, so the optical loss is relatively large. Therefore, the above arrangement may reduce the number of the layers passed through by the light reflected from the touch body and reduce the optical loss, so that the intensity of the light reaching the light sensing structure 121 is sufficiently high.

Continuing to refer to FIG. 7, FIG. 8 or FIG. 10, optionally, the vertical projection of the touch electrode layer 220 on the light blocking layer 130 is not overlapped with the collimation hole 131. This arrangement is advantageous to reduce the number of the layers passed through by the light reflected from the touch body and reduce the optical loss, so that the intensity of the light reaching the light sensing structure 121 is sufficiently high.

Continuing to refer to FIG. 10, optionally, the vertical projection of the touch lead 230 on the light blocking layer 130 is not overlapped with the collimation hole 131. This arrangement is advantageous to reduce the number of the layers passed through by the light reflected from the touch body and reduce the optical loss, so that the intensity of the light reaching the light sensing structure 121 is sufficiently high.

Figure 12:
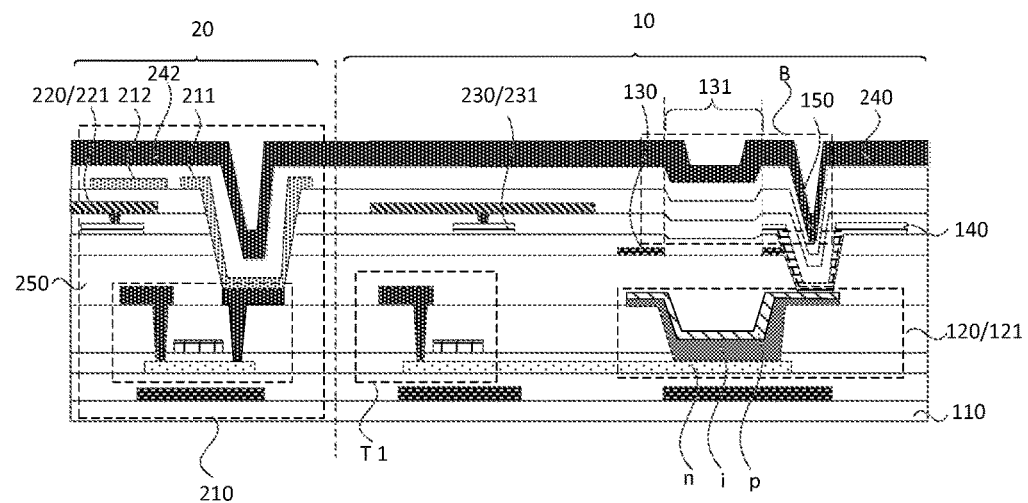
FIG. 12 is a structural diagram of an array substrate provided by an embodiment of the present disclosure.
Figure 13:
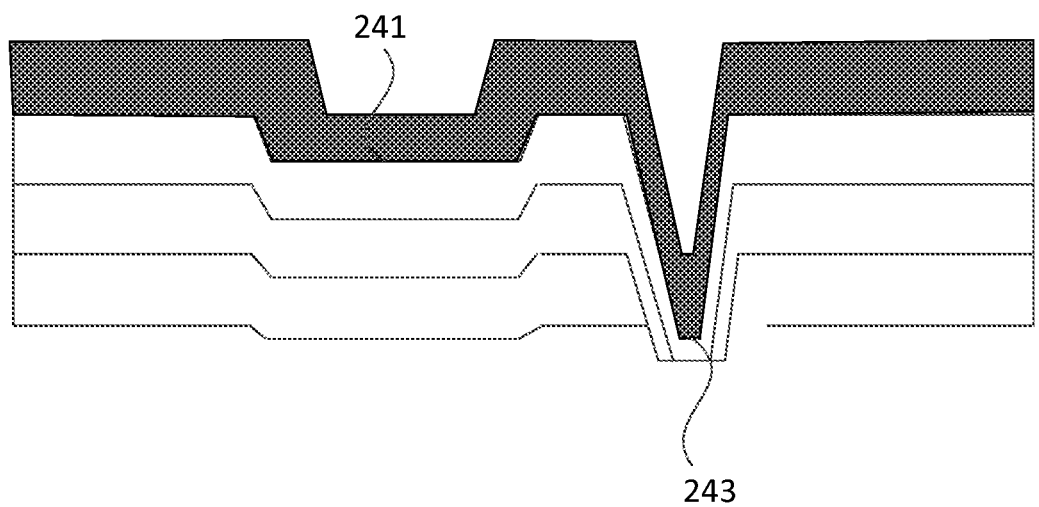
FIG. 13 is an enlarged schematic diagram of a portion B in FIG. 12.

On the basis of the above technical solutions, FIG. 12 is a structural diagram of an array substrate provided by an embodiment of the present disclosure. FIG. 13 is an enlarged schematic diagram of a portion B in FIG. 12. Referring to FIG. 12 and FIG. 13, optionally, the array substrate further includes multiple pixel units 210. The multiple pixel units 210 are not overlapped with the collimation hole 131. The array substrate further includes an alignment layer 240. In an area where the collimation hole 131 is located, a surface of the alignment layer 240 facing towards the base substrate 110 is a first surface 241. In an area where the pixel units 210 are located, a surface of the alignment layer 240 facing towards the base substrate 110 is a second surface 242. In an area where the electrode via 150 is located, a surface of the alignment layer 110 facing towards the base substrate 110 is a third surface 243. A height difference between the first surface 241 and the second surface 242 is less than a height difference between the third surface 243 and the second surface 242.

It should be noted that the second surface 242 refers to, in a sub-area farthest from the base substrate 110 in the area where the multiple pixel units 210 are located, the surface of the alignment layer 240 facing towards the base substrate 110.

Specifically, the height difference between the first surface 241 and the second surface 242 may be caused because of the arrangement of the collimation hole 131 and/or caused because that the touch lead 230 needs to bypass the collimation hole, the touch electrode layer 220 needs to bypass the collimation hole, the pixel electrode 221 needs to bypass the collimation hole, or the common electrode 212 needs to bypass the collimation hole. A height difference between the first surface 241 and the third surface 243 is mainly caused because of the arrangement of the electrode via 150.

It may be understood that, in an actual preparation process of a panel, the thickness of a planarization layer 250 is much greater than the thickness of the insulation layer among other layers and the thickness of multiple functional layers. Therefore, the electrode via 150 passing through the planarization layer 250 causes the height difference between the second surface 242 and the third surface 243 much greater than the height difference between the first surface 241 and the second surface 242. In this way, relative to the array substrate shown in FIG. 1, in the area where the collimation hole 131 is located, the depth of a dimple formed on the array substrate is relatively shallow, and the materials of the alignment layer stored in the dimple is relatively less. Thus, the thickness difference between the thickness of the alignment layer at the dimple and the thickness of the alignment layer at the planarization layer of the array substrate decreases, so that the problem of low light penetration ratio due to the accumulation of the materials of the alignment layer is alleviated.

It should be noted that, for convenience of drawing, in FIG. 2, FIG. 3 to FIG. 11, in the area where the collimation hole 131 is located, the dimple caused by the arrangement of the collimation hole 131 and the arrangement in which other layers bypasses the collimation hole 131 is not shown.

It should be noted that, because the array substrate includes more layers, FIG. 2, and FIG. 3 to FIG. 12 only show an example of at least one of functional layers related to the present disclosure: a first light blocking layer (which is located on a surface of the base substrate 110 facing towards the light blocking layer 130), a buffer layer (which is located on a surface of the first light blocking layer facing towards the light blocking layer 130), a display thin film transistor T2, and the insulation layer arranged among the functional layers or the planarization layer 250 arranged among the functional layers. Other layers in the array substrate may be understood according to the corresponding structures in other array substrates, which are not repeated in detail in the present disclosure.

Figure 14:
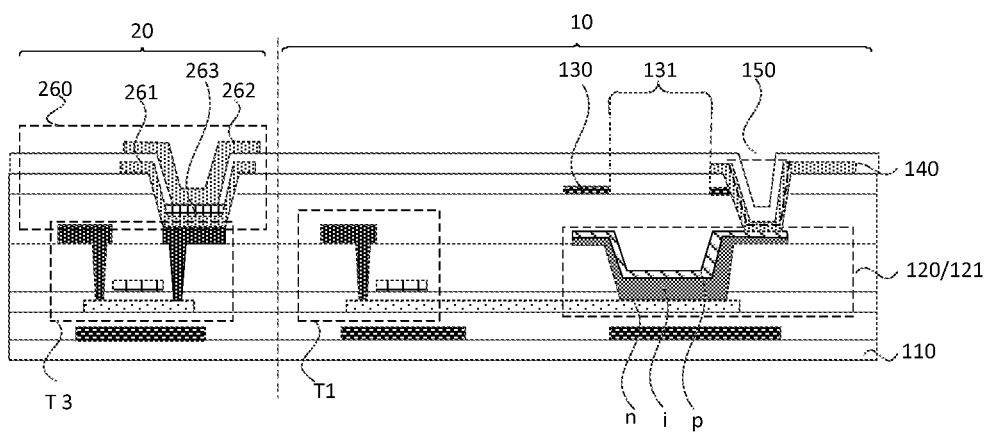
FIG. 14 is a structural diagram of an array substrate provided by an embodiment of the present disclosure.

FIG. 14 is a structural diagram of an array substrate provided by an embodiment of the present disclosure. Referring to FIG. 14, the array substrate includes a base substrate 110, a fingerprint recognition unit 120 with a light sensing structure 121, a light blocking layer 130 and an electrode connecting structure 140. Both the light blocking layer 130 and the electrode connecting structure 140 are arranged at the side of the light sensing structure 121 facing away from the base substrate 110. The light blocking layer 130 is provided with a collimation hole 131. The vertical projection of the collimation hole 131 on the base substrate 110 is partially overlapped with the vertical projection of the light sensing structure 121 on the base substrate 110. An insulation layer is arranged between the electrode connecting structure 140 and the light sensing structure 121. The insulation layer is provided with an electrode via 150. The electrode connecting structure 140 is connected to the light sensing structure 121 through the electrode via 150. The vertical projection of the collimation hole 131 on the base substrate 110 is not overlapped with the vertical projection of the electrode via 150 on the base substrate 110. Optionally, the array substrate further includes multiple light emitting units 260. The multiple light emitting units 260 are arranged at the side of the light sensing structure 121 facing away from the base substrate 110. The electrode connecting structure 140 and a cathode 262 or an anode 261 of each of the multiple light emitting units 260 are arranged on the same layer and made of the same material.

Optionally, as shown in FIG. 14, the anode 261 is arranged between the cathode 262 and the base substrate 110. At this time, the electrode connecting structure 140 and the anode 261 may be arranged on the same layer, or the electrode connecting structure 140 and the cathode 262 may be arranged on the same layer. Preferably, as shown in FIG. 14, the electrode connecting structure 140 and the anode 261 are arranged on the same layer. In this way, the number of the layers passed through by the electrode via 150 may be reduced, so that the difficulty of the process of the electrode via 150 is reduced.

Optionally, the cathode 262 is arranged between the anode 261 and the base substrate 110. At this time, the electrode connecting structure 140 and the anode 261 may be arranged on the same layer, or the electrode connecting structure 140 and the cathode 262 may be arranged on the same layer. Preferably, the electrode connecting structure 140 and the cathode 262 are arranged on the same layer. In this way, the number of layers passed through by the electrode via 150 may be reduced, so that the difficulty of the process of the electrode via 150 is reduced and the residual photoresist is avoided.

Specifically, the material of the anode 261 and the material of the cathode 262 may be any one of the ITO or the ATO, or other transparent conductive materials. This is not limited in the present disclosure.

It should be noted that, in the above arrangements, the electrode connecting structure and the abode, or the electrode connecting structure and the cathode are arranged on the same layer and made of the same material, so as to ensure that the preparation process of the electrode connecting structure matches with the preparation process of the existing array substrate, and ensure that the preparation process of the electrode connecting structure is simple. This may further cause the arrangement relation of the array substrate to be simple, and the design requirement of the thin array substrate to be implemented easily.

Figure 15:
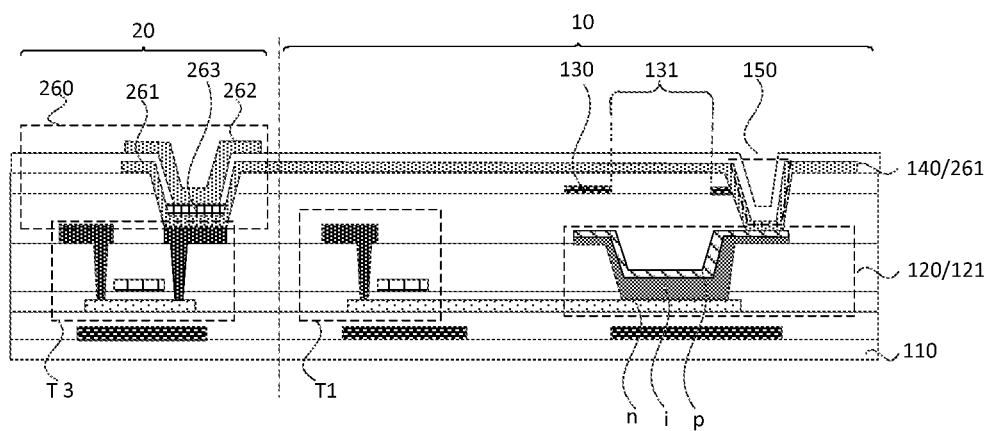
FIG. 15 is a structural diagram of another array substrate provided by an embodiment of the present disclosure.

FIG. 15 is a structural diagram of another array substrate provided by an embodiment of the present disclosure. Referring to FIG. 15, optionally, the array substrate further includes multiple light emitting units 260. The multiple light emitting units 260 are arranged at the side of the light sensing structure 121 facing away from the base substrate 110. Each of the multiple light emitting units 260 includes a cathode 262, an anode 261 and a light emitting function layer 263 arranged between the cathode 262 and the anode 261. One or more of the cathodes 262 or one or more of the anodes 261 are used as the electrode connecting structure 140. The electrode connecting structure 140 is configured to provide the cathode 262 or the anode 261 with the display drive signal in the display stage, and provide the light sensing structure 121 with the operating voltage signal in the fingerprint recognition stage.

Specifically, among multiple anodes 261, the anode of which the vertical projection on the light sensing structure 121 is at least partially overlapped with the light sensing structure 121 may be reused as the electrode connecting structure 140. Specifically, among multiple cathodes 262, the cathode of which the vertical projection on the light sensing structure 121 is at least partially overlapped with the light sensing structure 121 may be reused as the electrode connecting structure 140. The shape of the anode 261 and the shape of the cathode 262 may be a rectangle, diamond, etc. This is not limited in the present disclosure.

Optionally, as shown in FIG. 15, the anode 261 is arranged between the cathode 262 and the base substrate. At this time, one or more of the anodes 261 may be reused as the electrode connecting structure 140, or one or more of the cathode 262 may be reused as the electrode connecting structure 140. Preferably, as shown in FIG. 15, one or more of the anodes 261 are reused as the electrode connecting structure 140. In this way, the number of the layers passed through by the electrode via 150 may be reduced, so that the difficulty of the process of the electrode via 150 is reduced and the residual photoresist is avoided.

Optionally, the cathode is arranged between the anode 261 and the base substrate. At this time, one or more of the cathodes 262 may be reused as the electrode connecting structure 140, or one or more of the anodes 261 may be reused as the electrode connecting structure 140. Preferably, one or more of the cathodes 262 are reused as the electrode connecting structure 140. In this way, the number of the layers passed through by the electrode via 150 may be reduced, so that the difficulty of the process of the electrode via 150 is reduced and the residual photoresist is avoided.

It should be noted that, in the above arrangements, one or more of the anodes 261 or one or more of the cathodes 262 are reused as the electrode connecting structure 140, so that it is not necessary to reserve a space for the electrode connecting structure 140 on the layer where the multiple cathodes 262 or the layer where the multiple anodes 261 are located. Thus, it is not necessary to change the original distribution of the multiple anodes 261 on the layer where the multiple anodes 261 are located and the original distribution of the multiple cathode 262 on the layer where the multiple cathode 262 are located.

Optionally, the vertical projection of at least one of the cathode 2620 or anode 261 on the light blocking layer 130 is not overlapped with the collimation hole 131. This arrangement is advantageous to reduce the number of the layers passed through by the light reflected from the touch body and reduce the optical loss, so that the intensity of the light reaching the light sensing structure 121 is sufficiently high.

It should be noted that, because the array substrate includes more layers, FIG. 14 and FIG. 15 only show an example of at least one of the functional layers related to the present disclosure: the first light blocking layer (which is located on the surface of the base substrate 110 facing towards the light blocking layer 130), the buffer layer (which is located on the surface of the first light blocking layer facing towards the light blocking layer 130), a drive thin film transistor T3, and the insulation layer arranged among the functional layers or the planarization layer 250 arranged among the functional layers. Other layers in the array substrate may be understood according to the corresponding structures in other array substrates, which are not repeated in detail in the present disclosure.

It should be noted that, in order to clearly show the difference between the components of the array substrate in example embodiments and the array substrate in the background art, the components with the same name of the array substrate in example embodiments and the array substrate in the background art are marked by different reference numbers.

Based on the same conception of the present disclosure, an example embodiment of the present disclosure further provides a display device. The display device includes the array substrate described in any embodiment of the present disclosure. The display device provided by the example embodiment of the present disclosure has the beneficial effects of the array substrate provided by the example embodiment of the present disclosure, which are not repeated in detail herein. For example, the display device may be an in-vehicle display screen, cell phone, computer, television or other electronic display equipment, which is not limited in the present disclosure.

It should be noted that the above are only example embodiments of the present disclosure and technical principles applied in the present disclosure. Those skilled in the art will understand that the present disclosure is not limited to the specific embodiments described herein. For those skilled in the art, various obvious changes, readjustments and substitutions may be conducted without departing from the protection scope of the present disclosure. Therefore, although the present disclosure is described in detail through the above embodiments, without departing from the conception of the present disclosure, the present disclosure may include more equivalent embodiments.

What is claimed is:

1. An array substrate, comprising:
a base substrate;
a fingerprint recognition unit with a light sensing structure; and
a light blocking layer and an electrode connecting structure, wherein the light blocking layer and the electrode connecting structure are arranged at a side of the light sensing structure facing away from the base substrate;
wherein the light blocking layer is provided with a collimation hole, wherein a vertical projection of the collimation hole on the base substrate is partially overlapped with a vertical projection of the light sensing structure on the base substrate;
an insulation layer arranged between the electrode connecting structure and the light sensing structure, wherein the insulation layer is provided with an electrode via, and wherein the electrode connecting structure is connected to the light sensing structure through the electrode via;
wherein the vertical projection of the collimation hole on the base substrate is not overlapped with a vertical projection of the electrode via on the base substrate; and
wherein the array substrate further comprises:
a plurality of pixel units, wherein no pixel unit of the plurality of pixel units is overlapped with the collimation hole; and
an alignment layer;
wherein in an area where the collimation hole is located, a surface of the alignment layer facing towards the base substrate is a first surface; in an area where the plurality of pixel units are located, a surface of the alignment layer facing towards the base substrate is a second surface; in an area where the electrode via is located, a surface of the alignment layer facing towards the base substrate is a third surface; wherein a height difference between the first surface and the second surface is less than a height difference between the third surface and the second surface.

2. The array substrate of claim 1, wherein each pixel unit of the plurality of pixel units comprises a pixel electrode and a common electrode; and
wherein the electrode connecting structure and one of the pixel electrode and the common electrode are arranged on a same layer and made of a same material.

3. The array substrate of claim 2, wherein a vertical projection of at least one of the pixel electrode or the common electrode on the light blocking layer is not overlapped with the collimation hole.

4. The array substrate of claim 1, wherein each pixel unit of the plurality of pixel units comprises a pixel electrode and a common electrode; and
wherein the pixel electrode of one or more of the pixel units or the common electrode of one or more of the pixel units is reused as the electrode connecting structure, wherein the electrode connecting structure is configured to provide the pixel electrode or the common electrode with a display drive signal in a display stage, and provide the light sensing structure with an operating voltage signal in a fingerprint recognition stage.

5. The array substrate of claim 1, wherein each pixel unit of the plurality of pixel units comprises a pixel electrode and a common electrode; and
the array substrate further comprises a touch electrode layer;

wherein the touch electrode layer is arranged at the side of the light sensing structure facing away from the base substrate; and wherein the electrode connecting structure and the touch electrode layer are arranged on a same layer and made of a same material.

6. The array substrate of claim 5, wherein the touch electrode layer is arranged between the pixel electrode and the base substrate, and the touch electrode layer is arranged between the common electrode and the base substrate.

7. The array substrate of claim 5, wherein a vertical projection of the touch electrode layer on the light blocking layer is not overlapped with the collimation hole.

8. The array substrate of claim 1, wherein each pixel unit of the plurality of pixel units comprises a pixel electrode and a common electrode; and the array substrate further comprises a touch electrode layer;

wherein the touch electrode layer is arranged at the side of the light sensing structure facing away from the base substrate; and wherein the touch electrode layer comprises a plurality of touch electrodes, wherein one or more of the touch electrodes are reused as the electrode connecting structure, wherein the electrode connecting structure is configured to provide the touch electrodes with a touch signal in a touch stage and provide the light sensing structure with an operating voltage signal in a fingerprint recognition stage.

9. The array substrate of claim 8, wherein the touch electrode layer is arranged between the pixel electrode and the base substrate, and the touch electrode layer is arranged between the common electrode and the base substrate.

10. The array substrate of claim 1, further comprising:

a touch electrode layer arranged at the side of the light sensing structure facing away from the base substrate; and a touch lead electrically connected to the touch electrode layer;

wherein the electrode connecting structure and the touch lead are arranged on a same layer and made of a same material.

11. The array substrate of claim 10, wherein the touch lead is arranged between the touch electrode layer and the base substrate.

12. The array substrate of claim 10, wherein a vertical projection of the touch lead on the light blocking layer is not overlapped with the collimation hole.

13. The array substrate of claim 1, further comprising:

a touch electrode layer arranged at the side of the light sensing structure facing away from the base substrate; and a touch lead electrically connected to the touch electrode layer;

wherein the touch electrode layer comprises a plurality of touch electrodes, the touch lead comprises a plurality of touch sub-leads, and each of the touch sub-leads is connected to one of the touch electrodes;

wherein one or more touch sub-leads of the plurality of touch sub-leads are reused as the electrode connecting structure, and the electrode connecting structure is configured to provide the touch electrodes with a touch signal in a touch stage and provide the light sensing structure with an operating voltage signal in a fingerprint recognition stage.

14. The array substrate of claim 13, wherein the touch lead is arranged between the touch electrode layer and the base substrate.

15. The array substrate of claim 1, wherein the light sensing structure comprises an N-type semiconductor layer, an intrinsic semiconductor layer and a P-type semiconductor layer sequentially stacked along a direction from the base substrate towards the light blocking layer, wherein the electrode connecting structure is connected to the P-type semiconductor layer through the electrode via; or the light sensing structure comprises a P-type semiconductor layer, an intrinsic semiconductor layer and a N-type semiconductor layer sequentially stacked along the direction from the base substrate towards the light blocking layer, wherein the electrode connecting structure is connected to the N-type semiconductor layer through the electrode via.

16. A display device comprising an array substrate, wherein the array substrate comprises:

a base substrate;

a fingerprint recognition unit with a light sensing structure; and a light blocking layer and an electrode connecting structure, wherein the light blocking layer and the electrode connecting structure are arranged at a side of the light sensing structure facing away from the base substrate;

wherein the light blocking layer is provided with a collimation hole, wherein a vertical projection of the collimation hole on the base substrate is partially overlapped with a vertical projection of the light sensing structure on the base substrate;

wherein an insulation layer is arranged between the electrode connecting structure and the light sensing structure, wherein the insulation layer is provided with an electrode via, and the electrode connecting structure is connected to the light sensing structure through the electrode via;

wherein the vertical projection of the collimation hole on the base substrate is not overlapped with a vertical projection of the electrode via on the base substrate; and wherein the array substrate further comprises:

a plurality of pixel units, wherein no pixel unit of the plurality of pixel units is overlapped with the collimation hole; and an alignment layer;

wherein in an area where the collimation hole is located, a surface of the alignment layer facing towards the base substrate is a first surface; in an area where the plurality of pixel units are located, a surface of the alignment layer facing towards the base substrate is a second surface; in an area where the electrode via is located, a surface of the alignment layer facing towards the base substrate is a third surface; wherein a height difference between the first surface and the second surface is less than a height difference between the third surface and the second surface.

* * * * *